United States Patent [19]
Brannon et al.

[11] Patent Number: 5,345,346
[45] Date of Patent: Sep. 6, 1994

[54] POSITIVE FEEDBACK LOW INPUT CAPACITANCE DIFFERENTIAL AMPLIFIER

[75] Inventors: Craig M. Brannon, Maplewood; Tuan V. Ngo, Eden Prairie, both of Minn.

[73] Assignee: VTC Inc., Bloomington, Minn.

[21] Appl. No.: 39,859

[22] Filed: Mar. 30, 1993

[51] Int. Cl.⁵ .............. G11B 5/02; H03F 3/45; H03F 3/04; H03F 3/68
[52] U.S. Cl. ................. 360/67; 330/254; 330/260; 330/311
[58] Field of Search .............. 360/67, 65, 66, 46, 360/68; 330/254, 260, 294, 311, 85, 149, 253, 257, 258, 264, 277, 252, 253; 307/355; 324/523

[56] References Cited

U.S. PATENT DOCUMENTS

| | | | |
|---|---|---|---|
| 4,422,109 | 12/1983 | Sampei et al. | 360/66 X |
| 4,484,148 | 11/1984 | Wieser et al. | 330/260 X |
| 4,656,437 | 4/1987 | Saari | 330/253 |
| 4,713,625 | 12/1987 | Whatley | 330/149 |
| 4,785,258 | 11/1988 | Westwick | 330/253 |
| 4,857,863 | 8/1989 | Ganger et al. | 330/264 |
| 4,912,427 | 3/1990 | Rybicki | 330/257 |
| 4,956,729 | 9/1990 | Yatsugi et al. | 360/67 |
| 5,087,884 | 2/1972 | Brannon | 324/523 |
| 5,132,852 | 7/1992 | Price | 360/46 |
| 5,198,782 | 3/1993 | Scott | 330/277 |
| 5,202,645 | 4/1943 | Phan et al. | 330/253 |
| 5,206,605 | 4/1993 | Brannon et al. | 330/252 |
| 5,239,210 | 8/1993 | Scott | 330/258 X |
| 5,257,146 | 10/1993 | Price et al. | 360/67 |

Primary Examiner—John Shepperd
Assistant Examiner—Patrick Wamsley
Attorney, Agent, or Firm—Kinney & Lange

[57] ABSTRACT

A read preamplifier for use in reading data in a magnetic storage system uses positive feedback to reduce the preamplifier's input capacitance. The read preamplifier includes first and second voltage supply terminals. An input is coupled to the second voltage supply terminal and receives input signals from a connected magnetic head. An output is coupled to the first voltage supply terminal and to the input for producing output signals based upon the input signals. A positive feedback circuit, coupled to the input reduces the input capacitance of the read preamplifier.

17 Claims, 3 Drawing Sheets

POSITIVE FEEDBACK LOW INPUT CAPACITANCE DIFFERENTIAL AMPLIFIER

BACKGROUND OF THE INVENTION

The present invention relates to a magnetic head read/write preamplifier within a magnetic storage system. In particular, the present invention relates to a read differential preamplifier circuit with reduced input capacitance.

A magnetic storage system includes a magnetic head which reads and writes information on a recording surface of a magnetic medium, such as a magnetic disk. The magnetic head includes an inductive coil which reads and writes the information by sensing or creating a changing magnetic field. A read/write preamplifier is connected to the coils of the magnetic head at first and second head contacts. The preamplifier includes read circuitry and write circuitry for controlling the read and write operations.

The read circuitry includes a differential amplifier with first and second inputs connected across the head contacts. During read mode operation, the magnetic head's inductive coil passes through magnetic fields caused by adjacent polarized bit positions on the recording surface. Passing the inductive coil through these magnetic fields induces a voltage differential across the first-and second read amplifier inputs. Digital information, which is stored in the selected bit positions, is read from the surface of the magnetic medium by sensing the varying polarity of the voltages induced across the first and second head contacts.

In read preamplifier design, tradeoffs must usually be made between low input voltage noise and low input capacitance. It is difficult to design the read preamplifier with both low input voltage noise and low input capacitance. Low intrinsic base resistance of the input transistor pair is desirable because as the base resistance of the input device decreases, input noise levels also decrease. Decreasing the input noise improves the signal to noise ratio of the preamplifier and results in increased sensitivity which allows the read preamplifier to read data from magnetic storage media with increased data bit densities.

In the alternative, low input capacitance is desirable because, as the input capacitance increases, the bandwidth of the read preamplifier input stage decreases. As a result, high input capacitances cause the read preamplifier to have a low bandwidth. Low bandwidth limits the maximum rate at which data may be read from the surface of the magnetic media. Currently, read preamplifier designers must choose between a high signal to noise ratio and a high read data rate.

SUMMARY OF THE INVENTION

The read preamplifier of the present invention is used to detect and amplify input signals received from inductive coils of a magnetic head reading data from a magnetic storage system. The read preamplifier includes an input circuit for connecting to a magnetic head and receiving input signals from the magnetic head, an output circuit for producing output signals based upon the input signals, and a feedback or control circuit which controls the input capacitance as a function of feedback gain. The feedback circuit can be used to lower the input capacitance of the read preamplifier to increase the maximum rate that data may be read from the surface of a magnetic storage medium.

The read preamplifier of the present invention is connected between first and second voltage supply terminals. An input for connecting to and receiving input signals from a magnetic head, is coupled to the second voltage supply terminal. An output, coupled both to the first voltage supply terminal and to the input, produces output signals based upon the input signals. A positive feedback circuit, coupled to the input, reduces the input capacitance as a function of feedback gain.

In one preferred embodiment, the read preamplifier of the present invention is a differential preamplifier. In this embodiment, a first current source is coupled to the second voltage supply terminal. A first input stage transistor has a first electrode, a second electrode coupled to the first current source, and a control electrode which acts as a first input to the differential preamplifier. The first and second electrodes of the first input stage transistor are connected in series and form a portion of a first current path. A second input stage transistor has a first electrode, a second electrode coupled to the first current source, and a control electrode which acts as a second input to the differential preamplifier. The first and second electrodes of the second input stage transistor are connected in series and form a portion of a second current path.

A first output stage transistor has a first electrode coupled to the first voltage supply terminal through a first resistor, the first electrode acting as a first differential preamplifier output. The first output stage transistor also has a second electrode coupled to the first electrode of the first input stage transistor, and a control electrode for receiving first voltage signals which control the input capacitance of the first input stage transistor. The first and second electrodes of the first output stage transistor are connected in series with the first and second electrodes of the first input stage transistor and with the first resistor to form another portion of the first current path. A second output stage transistor has a first electrode coupled to the first voltage supply terminal through a second resistor, the first electrode acting as a second differential preamplifier output. The second output stage transistor also has a second electrode coupled to the first electrode of the second input stage transistor, and a control electrode for receiving second voltage signals which control the input capacitance of the second input stage transistor. The first and second electrodes of the second output stage transistor are connected in series with the first and second electrodes of the second input stage transistor and with the second resistor to form another portion of the second current path.

A first control means is coupled to the control electrode of the first output stage transistor for controlling the first voltage signals and thereby controlling the input capacitance of the first input stage transistor. A second control means is coupled to the control electrode of the second output stage transistor for controlling the second voltage signals and thereby controlling the input capacitance of the second input stage transistor.

DETAILED DESCRIPTION OF THE PREFERRED EMBODIMENTS

A. OVERVIEW

The input capacitance at the base of a bipolar junction transistor (BJT) can determined by:

$$C_{IN} = C_E + C_C(1 - A_V) \qquad \text{Eq. 1}$$

Where:

$C_{IN}$ is the input capacitance at the base of the transistor;

$C_E$ is the base-emitter junction capacitance of the transistor;

$C_C$ is the base-collector junction capacitance of the transistor; and $A_V$ is the gain of the transistor from its base to its collector.

For any given source resistance and inductance, as input capacitance $C_{IN}$ of a differential pair increases, the frequency response of the amplifier will decrease. Since input capacitance $C_{IN}$ is dependent upon gain $A_V$ of the transistor, transistors with higher gain will typically have higher input capacitance and a lower bandwidth. Gain $A_V$ of a transistor is determined by:

$$A_V = \frac{-R_C}{R_E} \qquad \text{Eq. 2}$$

Where:

$R_C$ is the collector resistance of the transistor; and $R_E$ is the emitter resistance of the transistor.

B. PRIOR ART PREAMPLIFIER 10

Figure 1:
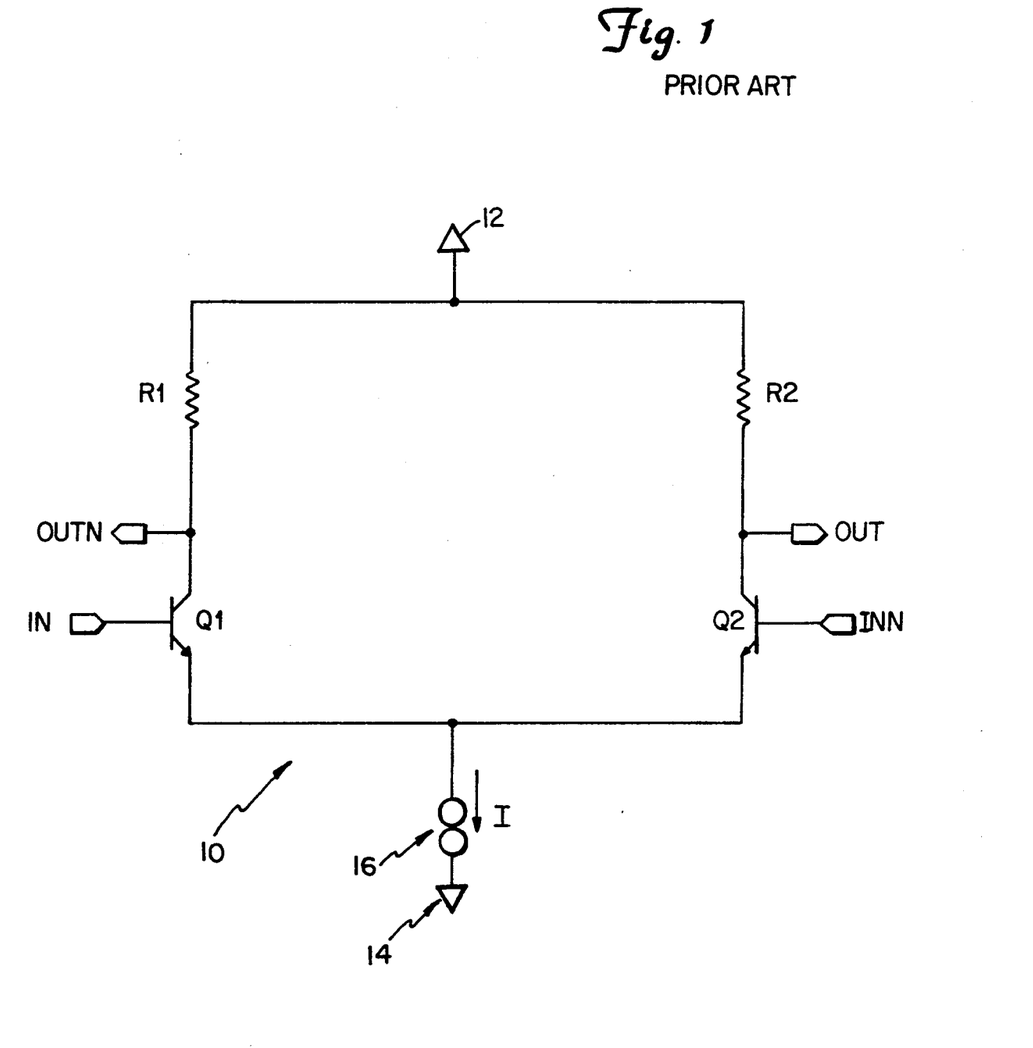
FIG. 1 is a schematic illustration of a first prior art differential read preamplifier.

FIG. 1 is a schematic illustration of prior art differential read preamplifier 10. Differential read preamplifier 10 includes first and second voltage supply terminals 12 and 14, constant current source 16, first and second input terminals or head contact terminals IN and INN, first and second input transistors Q1 and Q2, first and second output terminals OUTN and OUT, and resistors R1 and R2. Transistors Q1 and Q2 each have a control electrode or base which is connected to one of input terminals IN or INN, respectively. The emitters of transistors Q1 and Q2 are connected together. Current source 16 is connected between the emitters of transistors Q1 and Q2 and second voltage supply terminal 14. The collector of transistor Q1 is connected to output terminal OUTN and, through resistor R1, to first voltage supply terminal 12. Similarly, the collector of transistor Q2 is connected to output terminal OUT and, through resistor R2, to first voltage supply terminal 12.

In operation, gain $A_{VQ1}$ of transistor Q1 between IN and OUTN can be shown to be:

$$A_{VQ1} = \frac{-R_C}{R_E} \approx \frac{-R1}{r_{eQ1}} \qquad \text{Eq. 3}$$

Where:

$r_{eQ1}$ is the dynamic impedance at the emitter of transistor Q1 and can be determined for any given transistor by:

$$r_e = \frac{V_T}{I_C} \qquad \text{Eq. 4}$$

Where:

$V_T$ is the thermal voltage; and $I_C$ is the D.C. collector current conducted by the transistor.

In a design of prior art preamplifier 10 using typical component values, gain $A_{VQ1}$ for transistor Q1 is between negative 25 and negative 40. Therefore, using Eq. 1, input capacitance $C_{INQ1}$ at the base of input transistor Q1 of preamplifier 10 is at least:

$$C_{INQ1} = C_E + 26 C_C \qquad \text{Eq. 5}$$

The components of preamplifier 10 are matched such that gain $A_{VQ2}$ and input capacitance $C_{INQ2}$ at the base of transistor Q2 would be the same for transistor Q1.

C. PRIOR ART PREAMPLIFIER 50

Figure 2:
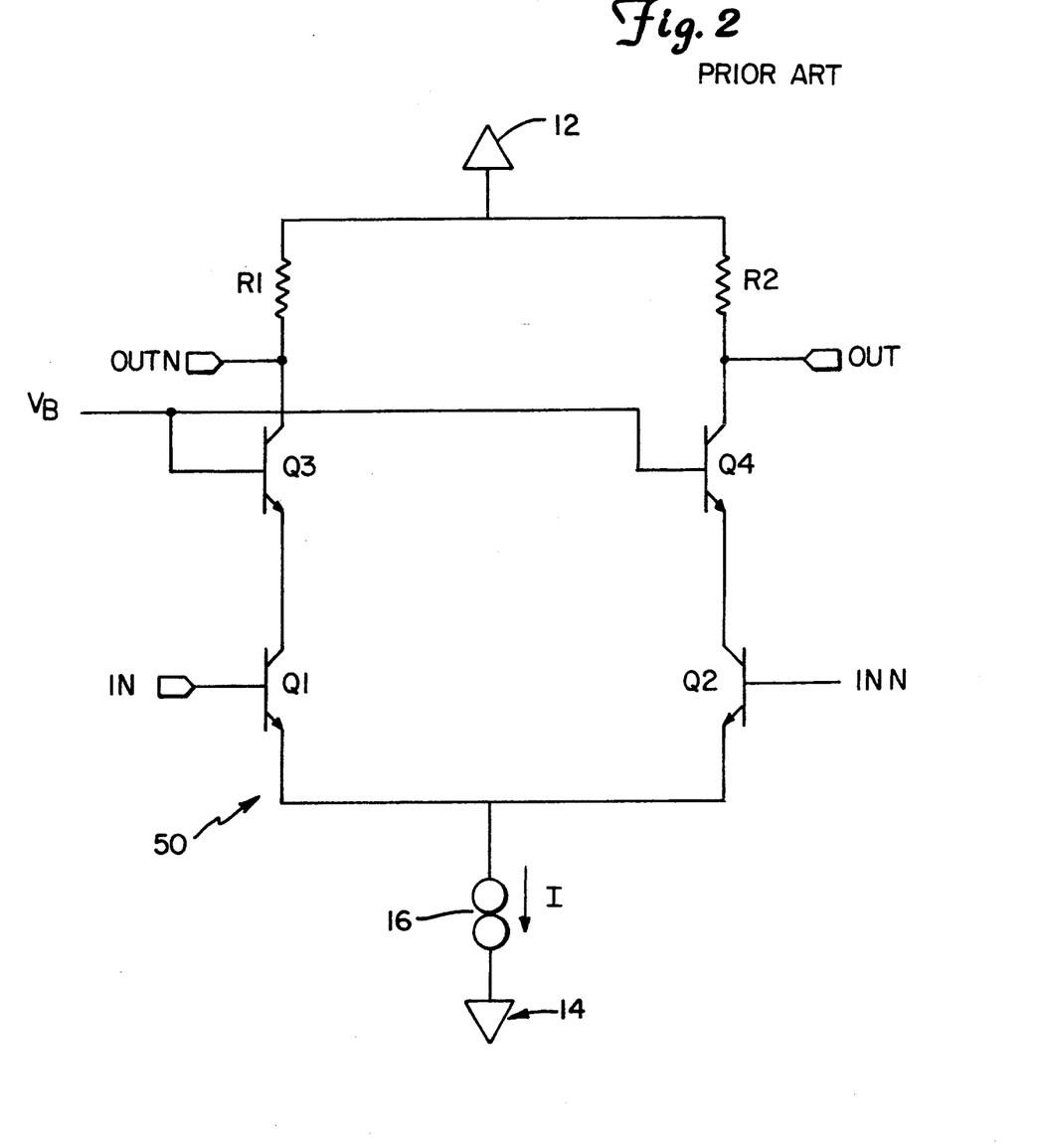
FIG. 2 is a schematic illustration of a second prior art differential read preamplifier.

FIG. 2 is a schematic illustration of second prior art differential read preamplifier 50. The configuration and components of preamplifier 50 are similar to preamplifier 10, and therefore for ease of illustration, preamplifiers 10 and 50 share common component labels. Preamplifier 50 includes all of the components in preamplifier 10 plus first and second cascode transistors Q3 and Q4. First cascode transistor Q3 is connected between resistor R1 and transistor Q1, with the emitter of transistor Q3 connected to the collector of transistor Q1 and the collector of transistor Q3 connected to resistor R1. Second cascode transistor Q4 is likewise connected between resistor R2 and transistor Q2, with the emitter of transistor Q4 connected to the collector of transistor Q2 and the collector of transistor Q4 connected to resistor R2. Instead of being connected to the collectors of transistors Q1 and Q2 as in the configuration of preamplifier 10, first and second output terminals OUTN and OUT are connected to the collectors of cascode transistors Q3 and Q4, respectively. The bases or control electrodes of transistors Q3 and Q4 are connected together in a common base configuration and biased by constant D.C. voltage $V_B$.

Prior art preamplifier 50 operates in substantially the same manner in preamplifier 10 operates, but with reduced input capacitance. As is preamplifier 10, the components of preamplifier 50 are matched so that gain $A_V$ and input capacitance $C_{IN}$ are the same for transistors Q1 and Q2. Therefore, discussion of the operation of preamplifier 50 is at times limited to one half of the total number of components.

Bias voltage $V_B$ maintains the base of transistor Q3 at a constant D.C. voltage, and because of the essentially constant voltage drop across the base-emitter junction of transistor Q3, maintains the emitter of transistor Q3 at a constant D.C. voltage as well. Therefore, the collector voltage of transistor Q1 is also maintained at a constant D.C. voltage, even as the input voltages at inputs IN and INN change.

Because transistors Q1 and Q3 are connected in series, D. C. collector current $I_{CQ3}$ for transistor Q3 will be essentially the same as D.C. collector current $I_{CQ1}$ for transistor Q1. Therefore, using Eq. 4, it can be seen that the dynamic emitter impedance $r_{eQ1}$ of transistor Q1 is essentially equal to the dynamic emitter impedance $r_{eQ3}$ of transistor Q3. Because the collector of transistor Q1 and the emitter of transistor Q3 are connected in series, dynamic impedance $r_{eQ3}$ acts as collector resistance $R_c$ for transistor Q1. Using equations 2 and 3, gain $A_{VQ1}$ for transistor Q1 in preamplifier 50 can be shown to be:

$$A_{VQ1} = \frac{-R_C}{R_E} = \frac{-R_C}{r_{eQ1}} = \frac{-r_{eQ3}}{r_{eQ1}} \approx -1 \qquad \text{Eq. 6}$$

Where:

$r_{eQ1}$ is the dynamic emitter impedance of transistor Q1; and $r_{eQ3}$ is the dynamic emitter impedance of transistor Q3.

With the negative unity gain of transistor Q1 as shown in Eq. 6, it can be seen that adding cascode transistor Q3 in preamplifier 50 reduces the input capacitance of transistor Q1 to:

$$C_{INQ1} = C_E + 2C_C \qquad \text{Eq. 7}$$

As stated above, transistor Q2 will have the same input capacitance as transistor Q1.

D. PREAMPLIFIER 100

1. OVERVIEW

Figure 3:
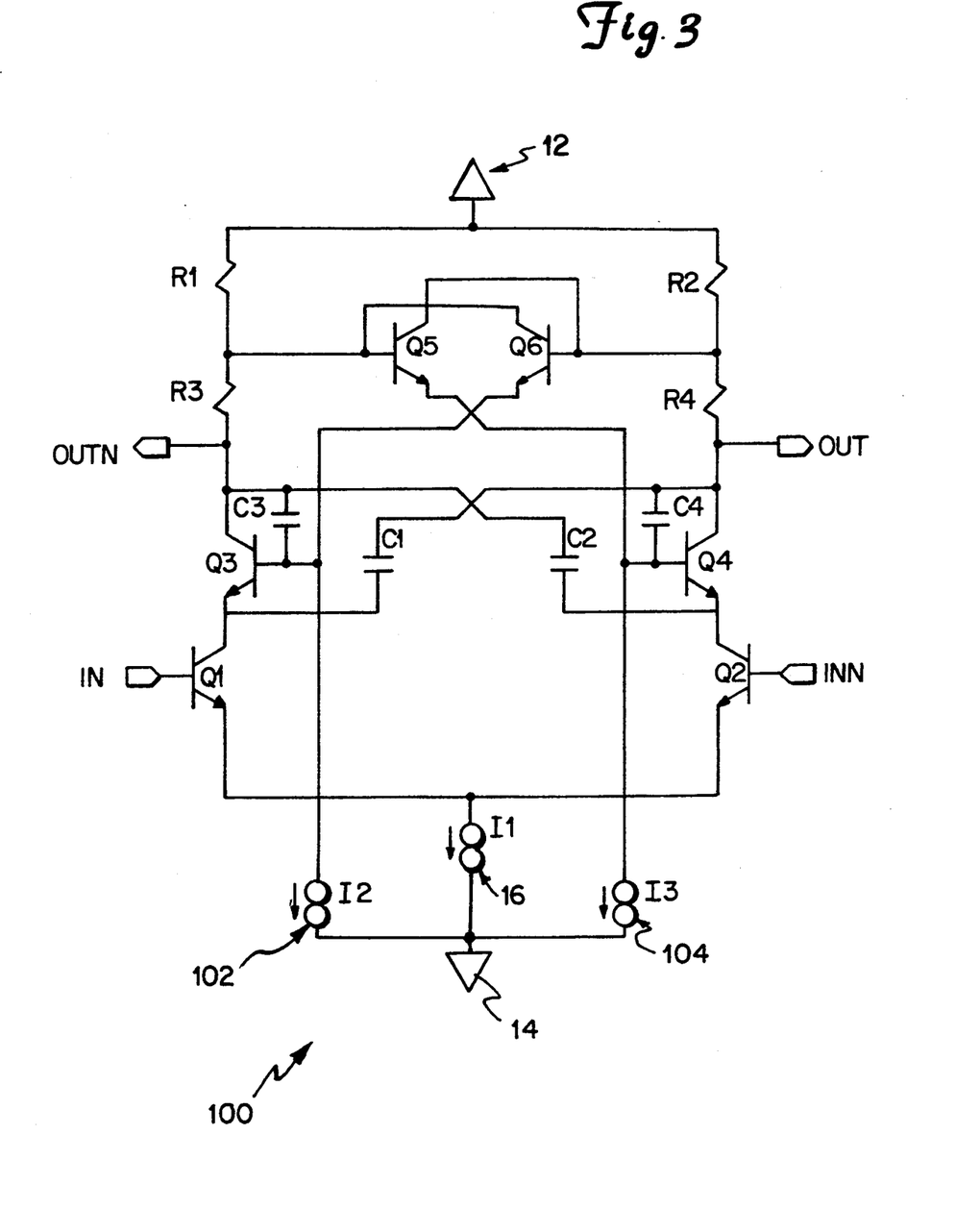
FIG. 3 is a schematic illustration of a differential read preamplifier in accordance with the present invention.

FIG. 3 is a schematic illustration of low input capacitance differential preamplifier 100 of the present invention. The configuration and components of preamplifier 100 are similar to preamplifiers 10 and 50 and therefore, preamplifiers 10, 50 and 100 share common component labels. Preamplifier 100 includes all of the components in preamplifier 50 plus resistors R3 and R4, feedback transistors Q5 and Q6, current sources 102 and 104, and capacitors C1, C2, C3 and C4.

Resistor R3 is connected between the collector of transistor Q3 and resistor R1. Resistor R4 is connected between the collector of transistor Q4 and resistor R2. The base of transistor Q5 is connected between resistors R1 and R3, while the base of transistor Q6 is connected between resistors R2 and R4. The emitter of transistor Q5 is connected to the base of transistor Q4. The emitter of transistor Q6 is similarly connected to the base of transistor Q3. The collectors of transistors Q5 and Q6 are cross coupled, with the collector of transistor Q5 connected to the base of transistor Q6 and the collector of transistor Q6 connected to the base of transistor Q5. Current source 102 is connected in series between the emitter of transistor Q6 and second voltage supply terminal 14. Current source 104 is connected in series between the emitter of transistor Q5 and second voltage supply terminal 14. Current sources 16, 102 and 104 may be of the kind which are adjustable to compensate for temperature variations. Capacitor C1 is connected between the emitter of transistor Q3 and the collector of transistor Q4. Capacitor C2 is connected between the emitter of transistor Q4 and the collector of transistor Q3. Capacitor C3 is connected between the base and collector of transistor Q3. Likewise, capacitor C4 is connected between the base and collector of transistor Q4. The remaining components are connected in the same configuration as preamplifiers 10 and 50.

Preamplifier 100 functions in a manner similar to preamplifier 50, but with a positive feedback circuit which reduces the input capacitances at the bases of input transistors Q1 and Q2 even further. As in preamplifier 50, the gains of transistors Q1 and Q2 are transferred to outputs OUTN and OUT at the collectors of cascode transistors Q3 and Q4, respectively. As shown in Eq. 6, dynamic emitter impedance $r_{eQ3}$ of transistor Q3 and dynamic emitter impedance $r_{eQ1}$ of transistor Q1 provide transistor Q1 with an initial gain of negative 1 between its base and collector. Likewise, the dynamic impedances of transistors Q4 and Q2 result in an initial gain of negative 1 between the base and collector of transistor Q2. However, preamplifier 100 differs in operation from preamplifier 50 by employing positive feedback or control circuits to make the gain of transistors Q1 and Q2 less negative than the negative unity gain of preamplifier 50, and thereby further reducing the input capacitance at the base of each of transistors Q1 and Q2.

As is the case with preamplifiers 10 and 50, the components of preamplifier 100 are matched so that, with equal voltages at inputs IN and INN, constant current I1 from current source 16 is split equally between transistors Q1 and Q2. In operation, input terminals IN and INN of preamplifier 100 are connected to the coils of a magnetic head. As the magnetic head passes over magnetic fields on the surface of a magnetic storage medium, a voltage differential is induced across the leads of the coil, and therefore across inputs IN and INN of preamplifier 100.

For illustrative purposes, assume that as the magnetic head passes through a magnetic field on the surface of the magnetic storage medium, the voltage at input IN increases with respect to the voltage at input INN. The current conducted by transistor Q1, and conducted through transistor Q3 and resistors R1 and R3, increases as the voltage at input terminal IN increases. Therefore, since the total current conducted by both transistor Q1 and transistor Q2 is equal to current I1, the current conducted by transistor Q2 decreases at the same time. As the current conducted by transistor Q2 decreases, the voltage drop across resistors R2 and R4 decreases and therefore, the voltages at output terminal OUT and at the base of transistor Q6 increase.

D.C. currents conducted through transistors Q1 and Q2 remain constant when the D.C. voltages at inputs IN and INN remain constant. However, A.C. current levels in transistors Q1 and Q2 may still be changed by changing the magnitude of A.C. voltage signals present at inputs IN and INN. In read mode operation, voltages induced across the leads of the magnetic head coil, and therefore across inputs IN and INN, are A.C. voltage signals representative of data read from the surface of the magnetic storage medium. Consequently, these A.C. voltage signals cause A.C. current changes in the collectors of transistors Q1 and Q2. As discussed above, the changes in A.C. current conducted by transistors Q1 and Q2 result in A.C. voltage changes at outputs OUT and OUTN which are representative of the input signals received at inputs IN and INN.

The overall amplifier gain $A_A$ between differential inputs IN and INN and differential outputs OUT and OUTN is approximately:

$$A_A \approx \frac{R1 + R3}{r_{eQ1}} \qquad \text{Eq. 8}$$

Where:

R1=R2; and R3=R4.

High overall amplifier gain $A_A$ is desirable to increase the signal to noise ratio of preamplifier 100.

2. POSITIVE FEEDBACK

The A.C. current conducted through transistors Q1 and Q2 also results in A.C. voltage signals being supplied at the bases of positive feedback transistors Q5 and Q6. For ease of illustration, discussion of positive feedback circuitry will at times be limited to transistor Q6 and its effect on the input capacitance of transistor Q1. However, it should be noted that transistor Q5 affects the input capacitance of transistor Q2 in the same manner.

The magnitude of the voltage signals supplied to the base of transistor Q6 is dependant upon the feedback gain of preamplifier 100, which is measured between input IN and the base of transistor Q6, and upon the magnitude of A.C. input signals at input IN. The feedback gain of preamplifier 100 at the base transistor Q6, and therefore at the base of transistor Q5 as well, is determined by:

$$A_F = \frac{R1}{r_{eQ1}} = \frac{R2}{r_{eQ2}} \qquad \text{Eq. 9}$$

Feedback transistors Q5 and Q6 conduct currents essentially equal to constant currents I3 and I2 from current sources 104 and 102, respectively. While conducting current I2, transistor Q6 will have a unity gain between its base and emitter. Therefore, voltage changes at the base of transistor Q6 will cause equal voltage changes at the base of transistor Q3. Similarly, unity gain between the base and emitter of transistor Q3 causes these voltage changes to be transferred to the collector of transistor Q1 as well. As a result, feedback gain $A_F$ between the base of transistor Q6 and input IN is transferred directly to the collector of transistor Q1. Therefore, adding feedback gain $A_F$ to the negative unity gain shown in Eq. 6, gain $A_{VQ1}$ between the base and collector of transistor Q1 in preamplifier 100 will be:

$$A_{VQ1} = \frac{-r_{eQ3}}{r_{eQ1}} + A_F \approx -1 + \frac{R1}{r_{eQ1}} \qquad \text{Eq. 10}$$

Once again, because of the matching of components in preamplifier 100, gain $A_{VQ2}$ of transistor Q2 will be the same as $A_{VQ1}$.

As can be seen from eqs. 1 and 10, if resistors R1 and R2 are too large, feedback gain $A_F$ will cause input capacitances $C_{INQ1}$ and $C_{INQ2}$ to become negative. Negative input capacitances result in instability of preamplifier 100. Therefore, R1 and R2 must be selected so that input capacitances $C_{INQ1}$ and $C_{INQ2}$ remain positive. Also as can be seen from Eq. 1, input capacitance $C_{INQ1}$ will be a minimum and non-negative when $A_{VQ1}$ is equal to 1. Therefore, to minimize input capacitance $C_{INQ1}$, it can be seen from Eq. 10 that resistor R1 should be selected so that:

$$R1 = 2(R_{eQ1}) \qquad \text{Eq. 11}$$

When R1 is equal to 2 times $r_{eQ1}$, input capacitance $C_{INQ1}$ for transistor Q1 will be:

$$C_{INQ1} = C_E \qquad \text{Eq. 12}$$

As discussed above, since the components of preamplifier 100 have been evenly matched, $C_{INQ2}$ will equal $C_{INQ1}$. Utilizing two collector resistors R1 and R3 (or R2 and R4) allows preamplifier 100 to limit the magnitude of feedback gain $A_F$ while still achieving high overall preamplifier 100 gain $A_A$. To achieve high overall gain $A_A$, R3 (and R4) will be much larger than R1 (and R2).

3. FREQUENCY RESPONSE COMPENSATION

The junction capacitances of transistors Q3, Q4, Q5 and Q6 add poles to the frequency response characteristics of preamplifier 100 which cause a gain roll off in the feedback circuit at higher frequencies. If the poles are not compensated for, preamplifier 100 will be unstable. Capacitors C1 and C2 add zeros to the feedback circuit frequency response of preamplifier 100 to compensate for the poles caused by transistors Q3, Q4, Q5 and Q6. The zeros added by capacitors C1 and C2 extend the bandwidth of the feedback circuit. The capacitance value of capacitors C1 and C2 is preferably chosen to place the zeros as close to the poles as possible in order to give the feedback circuit a more constant gain across a wider frequency range.

Capacitors C1 and C2 also provide additional stability at higher frequencies. At high frequencies, the response time of transistors Q3, Q4, Q5 and Q6 is reduced. Because of delays in the feedback signals caused by the reduced response times of transistors Q3, Q4, Q5 and Q6, the positive feedback signals can create instability in preamplifier 100. At higher frequencies, capacitors C1 and C2 become lower in impedance and provide a positive feedback boost which has a stabilizing effect.

As discussed above, capacitors C1 and C2 help extend the bandwidth of the feedback circuit. However, too much positive feedback at high frequencies also causes instability. Therefore, it is desirable to control the gain of the feedback circuit at these higher frequencies. Capacitors C3 and C4 provide additional poles which can be selectively located in order to give the feedback circuit controlled frequency roll off.

Cross coupling of the collectors of transistors Q5 and Q6 is another means of stabilizing the frequency response of preamplifier 100. As the input voltage at input IN increases relative to the voltage at input INN, the current conducted by transistor Q1 increases and the current conducted by Q2 decreases. Therefore, the current passing through resistor R1 increases while the current passing through resistor R2 decreases. As a result, as the voltage at the base of transistor Q5 decreases, the voltage at the base of transistor Q6 increases. By coupling the base of transistor Q5 to the collector of transistor Q6, and vice versa, the voltage swing between the base and the collector of transistors Q5 and Q6 is increased. As a result, the capacitance at the bases of transistors Q5 and Q6 is increased, which improves the stability of preamplifier 100.

Although the present invention has been described with reference to preferred embodiments, workers skilled in the art will recognize that changes may be made in form and detail without departing from the spirit and scope of the invention. For example, the positive feedback circuitry of the present invention could use different components and a different configuration to achieve the same result.

What is claimed is:

1. An improved read preamplifier of the type having a differential pair of transistors which act as first and second input transistors to the read preamplifier, having a first current source coupled to each of the first and second input transistors, having a first cascode stage transistor coupled to the first input transistor and a second cascode stage transistor coupled to the second input transistor, the first and second cascode stage transistors providing first and second outputs of the read preamplifier, the read preamplifier also having a first load coupled to the first cascode stage transistor and a second load coupled to the second cascode stage transistor, the improvement comprising:

first positive feedback gain control means, coupled between the second load and the first cascode stage transistor, for controlling the gain of the first input transistor and thereby controlling the input capacitance of the first input transistor; and     second positive feedback gain control means, coupled between the first load and the second cascode stage transistor, for controlling the gain of the second input transistor and thereby controlling the input capacitance of the second input transistor.

2. The improved read preamplifier of claim 1, wherein the first positive feedback gain control means includes a first feedback transistor and the second positive feedback gain control means includes a second feedback transistor, wherein the first feedback transistor has a first electrode, a second electrode coupled to the first cascode stage transistor, and a control electrode coupled to the second load, and wherein the second feedback transistor has a first electrode, a second electrode coupled to the second cascode stage transistor, and a control electrode coupled to the first load.

3. The improved read preamplifier of claim 2 wherein the first positive feedback gain control means further includes a second current source coupled to the second electrode of the first feedback transistor, and the second positive feedback gain control means further includes a third current source coupled to the second electrode of the second feedback transistor.

4. The improved read preamplifier of claim 1, the improvement further comprising:

a first frequency compensation capacitor coupled between the first input stage transistor and the second cascode stage transistor, for improving preamplifier stability at high frequencies; and     a second frequency compensation capacitor coupled between the second input stage transistor and the first cascode stage transistor, for improving preamplifier stability at high frequencies.

5. The improved read preamplifier of claim 1, the improvement further comprising:

a first frequency compensation capacitor coupled between a first electrode of the first cascode stage transistor and a control electrode of the first cascode stage for transistor, improving preamplifier stability at high frequencies; and     a second frequency compensation capacitor coupled between a first electrode of the second cascode stage transistor and a control electrode of the second cascode stage transistor, for improving preamplifier stability at high frequencies.

6. An improved read preamplifier of the type having a differential pair of transistors which act as first and second input transistors to the read preamplifier, having a first current source coupled to each of the first and second input transistors, having a first cascode stage transistor coupled to the first input transistor and a second cascode stage transistor coupled to the second input transistor, the first and second cascode stage transistors providing first and second outputs of the read preamplifier, the read preamplifier also having a first load coupled to the first cascode stage transistor and a second load coupled to the second cascode stage transistor, the improvement comprising:

means for establishing a positive gain for the first and second input transistors comprising:

a first feedback transistor having a first electrode, a second electrode coupled to the first cascode stage transistor, and a control electrode coupled to the second load;

a second feedback transistor having a first electrode, a second electrode coupled to the second cascode stage transistor, and a control electrode coupled to the first load;

a second current source coupled to the second electrode of the first feedback transistor; and         a third current source coupled to the second electrode of the second feedback transistor.

7. The improved read preamplifier of claim 6, the improvement further comprising:

a first frequency compensation capacitor coupled between the first input stage transistor and the second cascode stage transistor and the second cascode stage transistor, for improving preamplifier stability at high frequencies; and     a second frequency compensation capacitor coupled between the second input stage transistor and the first cascode stage transistor, for improving preamplifier stability at high frequencies.

8. The improved read preamplifier of claim 6, the improvement further comprising:

a first frequency compensation capacitor coupled between a first electrode of the first cascode stage transistor and a control electrode of the first cascode stage transistor, for improving preamplifier stability at high frequencies; and     a second frequency compensation capacitor coupled between a first electrode of the second cascode stage transistor and a control electrode of the second cascode stage transistor, for improving preamplifier stability at high frequencies.

9. A read differential preamplifier for use in reading data in a magnetic storage system, the read differential preamplifier comprising:

first and second voltage supply terminals;

a first current source coupled to the second voltage supply terminal; a first input stage transistor having a first electrode, a second electrode coupled to the first current source, and a control electrode which acts as a first input to the differential preamplifier, wherein the first and second electrodes are connected in series and form a portion of a first current path;

a second input stage transistor having a first electrode, a second electrode coupled to the first current source, and a control electrode which acts as a second input to the differential preamplifier, wherein the first and second electrodes are connected in series and form a portion of a second current path;

a first output stage transistor having a first electrode coupled to the first voltage supply terminal through a first resistor, the first electrode acting as a first differential preamplifier output, a second electrode coupled to the first electrode of the first input stage transistor, and a control electrode for receiving a first positive feedback signal, the first positive feedback signal controlling the input capacitance of the first input stage transistor, wherein the first and second electrodes of the first output stage transistor are connected in series with the first and second electrodes of the first input stage transistor and with the first resistor to form a portion of the first current path;

a second output stage transistor having a first electrode coupled to the first voltage supply terminal through a second resistor, the first electrode acting as a second differential preamplifier output, a second electrode coupled to the first electrode of the second input stage transistor, and a control electrode for receiving a second positive feedback signal, the second positive feedback signal controlling the input capacitance of the second input stage transistor, wherein the first and second electrodes of the second output stage transistor are connected in series with the first and second electrodes of the second input stage transistor and with the second resistor to form a portion of the second current path;

first control means coupled to the control electrode of the first output stage transistor for providing the first positive feedback signal as a function of a first input signal at the first input to the differential preamplifier to control the input capacitance of the first input stage transistor so that the differential preamplifier maximum read data rate increases; and second control means coupled to the control electrode of the second output stage transistor for providing the second positive feedback signal as a function of a second input signal at the second input to the differential preamplifier to control the input capacitance of the second input stage transistor so that the differential preamplifier maximum read data rate increases.

10. The read differential preamplifier of claim 9 wherein the first and second positive feedback signals control the input capacitances of the first and second input stage transistors by controlling gain of the first and second input stage transistors.

11. The read differential preamplifier of claim 9 wherein the first and second control means control the first and second positive feedback signals, respectively, to establish a positive gain between the control electrode and the first electrode of the first input stage transistor and between the control electrode and the first electrode of the second input stage transistor.

12. The read differential preamplifier of claim 9 wherein the first and second control means comprise first and second positive feedback circuits.

13. The read differential preamplifier of claim 9 and further comprising:

a third resistor coupled in series between the first resistor and the first electrode of the first output stage transistor, the third resistor forming a portion of the first current path; and a fourth resistor coupled in series between the second resistor and the first electrode of the second output stage transistor, the fourth resistor forming a portion of the second current path.

14. The read differential preamplifier of claim 13, wherein the first control means comprises:

a first feedback current source coupled to the second voltage supply terminal; and a first feedback transistor having a first electrode coupled to a connection between the first resistor and the third resistor, a second electrode coupled to the first feedback current source and to the control electrode of the first output stage transistor, and a control electrode coupled to a connection between the second resistor and the fourth resistor.

15. The read differential preamplifier of claim 14, wherein the second control means comprises:

a second feedback current source coupled to the second voltage supply terminal; and a second feedback transistor having a first electrode coupled to a connection between the second resistor and the fourth resistor, a second electrode coupled to the second feedback current source and to the control electrode of the second output stage transistor, and a control electrode coupled to a connection between the first resistor and the third resistor.

16. The read preamplifier of claim 9 and further comprising:

a first frequency compensation capacitor coupled between the first electrode of the first input stage transistor and the first electrode of the second output stage transistor, for providing positive feedback to the first electrode of the first input stage transistor at high frequencies; and a second frequency compensation capacitor coupled between the first electrode of the second input stage transistor and the first electrode of the first output stage transistor, for providing positive feedback to the first electrode of the second input stage transistor at high frequencies.

17. The read preamplifier of claim 9 and further comprising:

a first frequency compensation capacitor coupled between the first electrode and the control electrode of the first output stage transistor, for providing preamplifier stability at high frequencies; and a second frequency compensation capacitor coupled between the first electrode and the control electrode of the second output stage transistor, for providing preamplifier stability at high frequencies.

* * * * *

UNITED STATES PATENT AND TRADEMARK OFFICE
CERTIFICATE OF CORRECTION

PATENT NO. : 5,345,346
DATED : September 6, 1994
INVENTOR(S) : Craig M. Brannon, et. al.

It is certified that error appears in the above-indentified patent and that said Letters Patent is hereby corrected as shown below:

Col. 1, line 29, delete "first-and", insert --first and--

Col. 3, line 11, delete "can", insert --can be--

Col. 4, line 47, delete "As is", insert --As in--

Col. 4, line 62, delete "D. C.", insert --D.C.--

Col. 7, line 13, delete "dependant", insert --dependent--

Col. 7, line 47, delete "eqs. 1", insert --Esq. 1--

Col. 9, line 52, delete "for transistor,", insert --transistor, for--

Col. 10, lines 21-22, delete "and the second cascode stage transistor"

Col. 10, delete lines 45-52, insert -- a first current source coupled to the second voltage supply terminal;

UNITED STATES PATENT AND TRADEMARK OFFICE
CERTIFICATE OF CORRECTION

PATENT NO. : 5,345,346
DATED : September 6, 1994
INVENTOR(S) : Craig M. Brannon, et al.

It is certified that error appears in the above-indentified patent and that said Letters Patent is hereby corrected as shown below:

a first input stage transistor having a first electrode, a second electrode
   coupled to the first current source, and a control electrode
   which acts as a first imput to the differential preamplifier,
   wherein the first and second electrodes are connected in series
   and form a portion of a first current path;

Signed and Sealed this

Twenty-fourth Day of January, 1995

Attest:

BRUCE LEHMAN

Attesting Officer        Commissioner of Patents and Trademarks